United States Patent [19]

Grandia et al.

[11] 4,350,116
[45] Sep. 21, 1982

[54] HOLDER FOR LIQUID PHASE EPITAXIAL GROWTH

[75] Inventors: Johannes Grandia; William G. McChesney; Hugo A. E. Santini; Harold L. Turk, all of San Jose, Calif.

[73] Assignee: International Business Machines Corporation, Armonk, N.Y.

[21] Appl. No.: 219,075

[22] Filed: Dec. 22, 1980

Related U.S. Application Data

[63] Continuation of Ser. No. 79,772, Sep. 28, 1979, abandoned.

[51] Int. Cl.$^3$ .............................................. B05C 13/02
[52] U.S. Cl. ................................. 118/500; 118/503; 118/428; 148/171; 211/41; 269/903; 156/621
[58] Field of Search ............... 118/500, 503, 504, 505, 118/428; 211/41, 46; 148/171; 269/46, 21, 902, 903; 432/253; 156/621

[56] References Cited

U.S. PATENT DOCUMENTS 3,974,797  8/1976  Hutson ........................... 118/500 X
4,190,683  2/1980  Davies et al. ................... 427/128 X

OTHER PUBLICATIONS

Yamaguchi et al, "Epitaxial Growth of YSm-LuCaGeIG Films With Three Micron Diameter Magnetic Bubbles", Fujitsu Scientific and Technical Journal, vol. 15, No. 1, Mar. 1979, pp. 69–90.

Primary Examiner—John D. Smith
Assistant Examiner—Bernard F. Plantz
Attorney, Agent, or Firm—Joseph E. Kieninger

[57] ABSTRACT

A holder for liquid phase epitaxial (LPE) growth which eliminates mesas on the surface of the film is described. The holder has two legs to which a ring is connected. The ring has holding means so that it can hold one wafer or two wafers back-to-back. One of the two legs extends vertically below the first ring. In a preferred embodiment a second ring having holding means for a pair of wafers back-to-back is attached to the elongated leg. This holder structure prevents a film from the liquid melt from forming when the holder is withdrawn from the liquid growth solution, thereby eliminating the formation of mesas which occur when the film ruptures.

4 Claims, 4 Drawing Figures

HOLDER FOR LIQUID PHASE EPITAXIAL GROWTH

This is a continuation of application Ser. No. 79,772 filed 9/28/79, now abandoned.

DESCRIPTION

1. Technical Field

This invention relates to forming a liquid phase epitaxial film and more particularly to an improved holder used in forming a liquid phase epitaxial film on a wafer.

It is a primary object of this invention to provide an improved wafer holder used in forming a liquid phase epitaxial film on a wafer.

It is another object of this invention to provide a wafer holder used in forming a liquid phase epitaxial film in which the resultant wafer is substantially mesa-free.

It is another object of this invention to provide a wafer holder used in liquid phase epitaxial film growth that prevents a thin liquid film from the liquid growth solution from forming between the bottom wafer and the surface of the liquid growth solution when the wafer is withdrawn from the liquid growth solution.

It is still another object of this invention to provide a wafer holder used in forming a liquid phase epitaxial film on a pair of wafers that are stacked in a substantially back-to-back relationship.

2. Description of the Prior Art

Magnetic bubble domain devices have a magnetic garnet film, for example, EuYGaFe garnet on a nonmagnetic garnet substrate, for example, $Gd_3Ga_5O_{12}$ (GGG). These films are formed by a typical standard liquid phase epitaxial (LPE) method using conventional wafer holders having two, three or four legs to support the substrates as shown in FIGS. 1A, 1B and 1C. Typically, when growing a film on wafers by this method, a plurality of wafers which are stacked horizontally in a wafer holding means so that the spacing between the wafers is substantially the same. The wafer holder is immersed in a liquid melt and rotated so that the wafers are positioned horizontally while the film grows. After the film growth has been completed, the wafer holder is removed while maintaining the wafers in a horizontal position. The wafer holder is then rotated to spin off the excess melt from the wafers while maintaining the wafers in their horizontal position. With this approach, the method yields wafers which have a number of defects in the surface in the form of mesas. It is desirable to have as few mesa defects as possible. A mesa defect is a raised area on the wafer that occurs when a liquid droplet is not removed.

This method can also be used with pair of wafers stacked back-to-back in the wafer holder in order to increase the throughput. However, it has been found that the film on the bottom wafer of each wafer pair has substantially more surface defects than the film on the top wafer. As a result of the increased number of surface defects on the surface of the bottom wafer, these wafers are poor candidates for device fabrication.

One LPE approach for the growing of films on a plurality of wafers to yield films having a reduced number of mesa defects is described in the patent to Davies et al. U.S. Pat. No. 4,190,683, and assigned to the assignee of the present invention. This approach involved using a wafer holder having two, three or four legs that is adapted to permit the wafers to be positioned at an angle from the horizontal plane or in the horizontal plane.

With this approach, the liquid phase epitaxial film is grown while the wafer is in the horizontal plane. The wafer holder is adjusted so that the wafer is tilted while the wafer is being removed from the melt. The wafer holder is then readjusted so that the wafer is in a horizontal plane again and rotated to remove the remaining drops from the edge of the wafer.

BRIEF DESCRIPTION OF THE FIGURES

In the accompanying drawings forming a material part of this disclosure.

DISCLOSURE OF THE INVENTION

For a further understanding of the invention, and the objects and advantages thereof, reference will be had to the following description and the accompanying drawings, and to the appended claims in which the various novel features of the invention are more particularly set forth.

A holder for liquid phase epitaxial (LPE) growth which eliminates mesas on the surface of the film is described. The holder has two legs to which a ring is connected. The ring has holding means so that it can hold one wafer or two wafers back-to-back. One of the two legs extends vertically below the first ring. In a preferred embodiment a second ring having holding means for a pair of wafers in a substantially back-to-back relationship is attached to the elongated leg. This holder structure prevents the film from the liquid melt from forming when the holder is withdrawn from the liquid growth solution, thereby eliminating the formation of mesas which occur when the film ruptures.

BEST MODE FOR CARRYING OUT THE INVENTION

Figure 2:
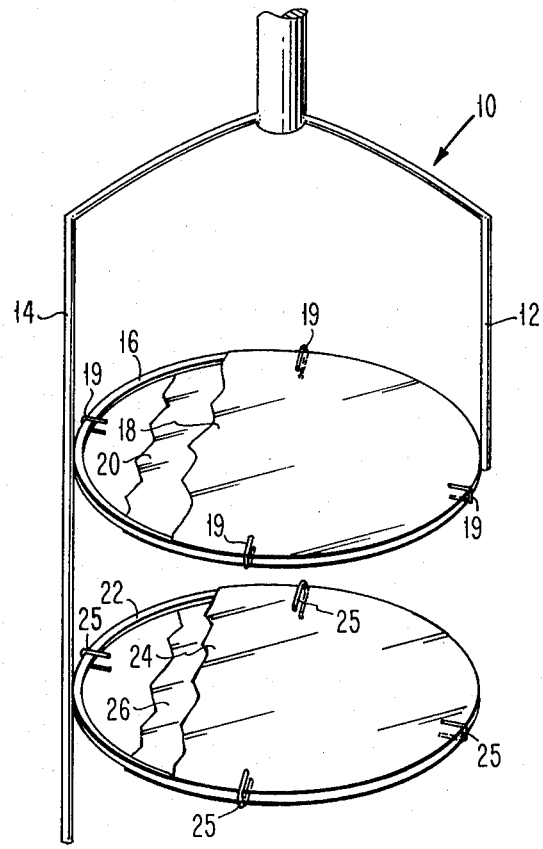
FIG. 2 is a three-dimensional view of the wafer holder of this invention.

A wafer holder suitable for performing LPE film growth is shown in FIG. 2. The wafer holder 10 has two legs 12 and 14. A ring 16 is connected to leg 12 and to leg 14. Wafers 18 and 20 are attached to the ring 16 by means of wire clips 19. The leg 14 extends below the ring 16 and ring 22 is connected thereto. Wafers 24 and 26 are attached to ring 22 with wire clips 25. Rings 22 and 16 are spaced so that there is about 1.5 cm spacing between wafer 20 and wafer 24.

While the wafer holder shown in FIG. 2 has one leg which supports two wire rings, the holder leg may support three, four or more rings. For example, when four rings are connected to the one leg, it is possible to attach four pairs of wafers making a total of eight wafers on which films are grown. The spacing between wafers or wafer pairs should be of the order of 1.5 centimeters as set forth previously.

EXAMPLE NO. 1

Using the wafer holder shown in FIG. 2, two pair of 3" wafers were immersed in a standard bubble garnet melt used for growing epitaxial films for three minutes and then removed. After the holder was rotated to remove the excess melt, the number of mesa defects on the surface were counted. A total of ten runs were made to form epitaxial films on 40 wafers. The average number of defects per wafer in this group of wafers was 0.5 defects. Similar data was obtained on 40 wafers using the four-legged holder shown in FIG. 1A and on 40 wafers using the two-legged holder shown in FIG. 1C. There were an average of 26 defects/wafer when the FIG. 1A holder was used and 2 defects/wafer when the FIG. 1C holder was used.

EXAMPLE NO. 2

Figure 1A:
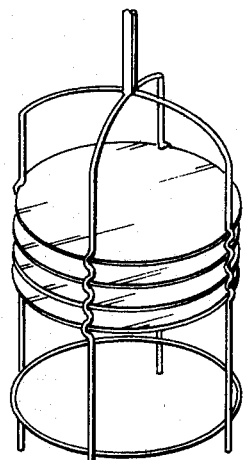
FIG. 1A, 1B and 1C are three-dimensional views of prior art wafer holders.
Figure 1B:
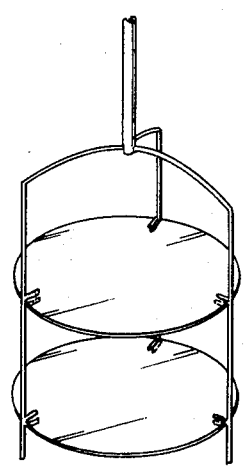
Figure 1C:
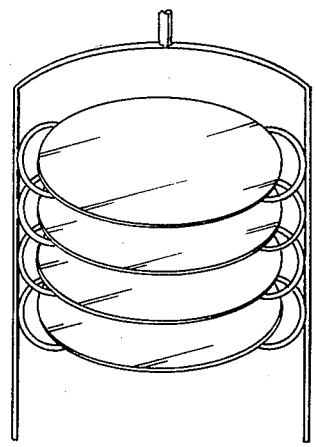

Another series of tests were conducted in which the holders in FIGS. 1A, FIG. 1C and FIG. 2 were compared. This time a visual determination was made based on a scale of 0 to 10 where "0" represents no defects on the film surface and "10" represents a large number of defects. In this comparison, the FIG. 2 holder had an average rating of 0.5 for 27 wafers; the FIG. 1A holder had an average rating of 7 for 31 wafers; and the FIG. 1C holder had an average rating of 2 for 9 wafers.

Industrial Applicability

The primary advantages of the wafer holder in accordance with this invention are that the surface of the epitaxial film formed has a small number of defects, the holder is easy to handle, and no spacer is required between the wafers.

The wafer holder in accordance with this invention eliminates the formation of a liquid film between the bottom of the wafer and the liquid melt and/or between wafers when the holder is withdrawn from the melt. This film in prior art holders subsequently breaks and splatters the wafer surfaces, thereby resulting in mesa defects.

While I have illustrated and described the preferred embodiments of my invention, it is understood that I do not limit myself to the precise steps herein and the right is secured to allow changes and modifications coming within the scope of the invention as defined in the appended claims.

We claim:

1. A wafer holder for use in growing liquid phase epitaxial films on wafers comprising:
   a first leg extending vertically;
   a second leg extending vertically and beyond said first leg;
   a first ring for holding at least one wafer and connected to said first and second legs, and
   a second ring for holding at least one wafer connected only to said second leg and spaced from said first ring wherein the mesa count on the films is held to a minimum.

2. A wafer holder as described in claim 1 including means associated with said first ring to hold a pair of wafers in a substantially back-to-back relationship.

3. A wafer holder as described in claim 1 including at least one additional ring connected only to said second leg in spaced relationship to said second ring.

4. A wafer holder as described in claim 3 including 2 additional rings connected only to said second leg.

* * * * *